United States Patent
Jayapal et al.

(10) Patent No.: US 11,004,480 B2
(45) Date of Patent: May 11, 2021

(54) LEAKAGE CURRENT REDUCTION IN A DUAL RAIL DEVICE

(71) Applicant: MediaTek Singapore Pte. Ltd., Singapore (SG)

(72) Inventors: Senthilkumar Jayapal, Singapore (SG); Chaoqun Liu, Singapore (SG); Yipin Wu, Singapore (SG); Soh Chee Keong, Singapore (SG)

(73) Assignee: MediaTek Inc., Hsinchu (TW)

( * ) Notice: Subject to any disclaimer, the term of this patent is extended or adjusted under 35 U.S.C. 154(b) by 0 days.

(21) Appl. No.: 16/253,210

(22) Filed: Jan. 21, 2019

(65) Prior Publication Data
US 2020/0234737 A1 Jul. 23, 2020

(51) Int. Cl.
*G11C 7/00* (2006.01)
*G11C 5/14* (2006.01)
*G11C 11/417* (2006.01)

(52) U.S. Cl.
CPC .............. *G11C 5/14* (2013.01); *G11C 11/417* (2013.01)

(58) Field of Classification Search
CPC ...................................................... G11C 5/14
USPC ............................................................ 365/226
See application file for complete search history.

(56) References Cited

U.S. PATENT DOCUMENTS

| | | | |
|---|---|---|---|
| 9,690,365 B2 * | 6/2017 | Mair .................... | G06F 1/3296 |
| 10,446,196 B1 * | 10/2019 | Narasimhan .......... | G11C 11/417 |
| 2015/0089250 A1 | 3/2015 | Hess | |
| 2015/0340354 A1 * | 11/2015 | Motomura ............ | G06F 1/3287 |
| | | | 327/566 |
| 2018/0062640 A1 | 3/2018 | Lovett | |

OTHER PUBLICATIONS

H. Kawaguchi, K. Nose, and T. Sakurai, "A CMOS scheme for 0.5 V supply voltage with pico-ampere standby current," in IEEE Int. Solid-State Circuits Conf. (ISSCC) Dig. Tech. Papers, pp. 192-193, Feb. 1998.

* cited by examiner

*Primary Examiner* — Hoai V Ho
(74) *Attorney, Agent, or Firm* — Tong J. Lee

(57) ABSTRACT

A device for reducing leakage current includes a memory cell array, a power switch and a core logic. The memory cell array is electrically connected to a first power rail which supplies a first voltage level. The core logic circuitry is electrically connected to a second power rail via the power switch when the power switch is turned on. The second power rail supplies a second voltage level which is lower than the first voltage level. The power switch is to be turned off by the first voltage level supplied to a gate terminal of the power switch, to thereby disconnect the core logic circuitry in a sleep state from the second power rail.

20 Claims, 8 Drawing Sheets

| Modes of operation | ODSleep | pdb (sleepb) | BuffDVDD | opdb (sleepb) | DVDD | p1 state | p2 state | PSH state |
|---|---|---|---|---|---|---|---|---|
| Non-overdrive mode | Logic '1' (RVDD) | Logic '1' (RVDD) | RVDD | Logic '1' (RVDD) | RVDD | OFF | ON | ON |
|  | 0 | 0 |  | 0 | 0 |  |  | OFF (RVDD) |
| Overdrive mode | Logic '0' (CVCC) | Logic '1' (CVCC) | CVCC | Logic '1' (CVCC) | RVDD | ON | OFF | ON |
|  | 0 | 0 |  | 0 | 0 |  |  | OFF (CVCC) |

FIG. 6

US 11,004,480 B2

LEAKAGE CURRENT REDUCTION IN A DUAL RAIL DEVICE

TECHNICAL FIELD

The invention relates to power management in a dual rail device.

BACKGROUND

A dual rail processor separates the voltage of memory cells from the voltage of logic circuits. This separation allows the memory cells to have a stable voltage within a safe voltage range, while the logic circuit voltage may be lowered to reduce power consumption. The reduction of power consumption is directly linked to battery lifetime of battery-powered devices, such as mobile devices and Internet-of-things (IoT) devices. To further extend battery lifetime, a device controls the leakage current that flows through its logic circuit when the device is not in use, e.g., in the sleep or standby state. Leakage power reduction in the sleep state significantly extends the operation time of a battery-powered device.

One approach for leakage power reduction is to shut down the core logic during the sleep state. Some existing techniques use power gating cells as a power switch for cutting off the power supplied to the core logic. However, these techniques either fail to achieve sufficient power reduction, or incur substantial increase in additional circuitry or system complexity.

SUMMARY

In one embodiment, a device is provided to reduce leakage current. The device comprises a memory cell array, a power switch and a core logic circuitry. The memory cell array is electrically connected to a first power rail which supplies a first voltage level. The core logic circuitry is electrically connected to a second power rail via the power switch when the power switch is turned on. The second power rail supplies a second voltage level which is lower than the first voltage level. The power switch is to be turned off by the first voltage level supplied to a gate terminal of the power switch, to thereby disconnect the core logic circuitry in a sleep state from the second power rail.

In another embodiment, a method performed by a device is provided for leakage current reduction. The method comprises: supplying an on-voltage level to a power switch to turn on the power switch. The power switch, when turned on, electrically connects a core logic circuitry to a second power rail which supplies a second voltage level. The device includes a memory cell array electrically connected to a first power rail supplying a first voltage level higher than the second voltage level. The method further comprises: supplying the first voltage level to the power switch to turn off the power switch, to thereby disconnect the core logic circuitry in a sleep state from the second power rail.

Advantages of the invention will be explained in detail in the following description.

BRIEF DESCRIPTION OF THE DRAWINGS

The invention is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one. Further, when a particular feature, structure, or characteristic is described in connection with an embodiment, it is submitted that it is within the knowledge of one skilled in the art to effect such feature, structure, or characteristic in connection with other embodiments whether or not explicitly described.

FIG. 6 is a table illustrating the states of a number of signals and switches in the circuit of FIG. 4 according to one embodiment.

DETAILED DESCRIPTION

Figure 1:
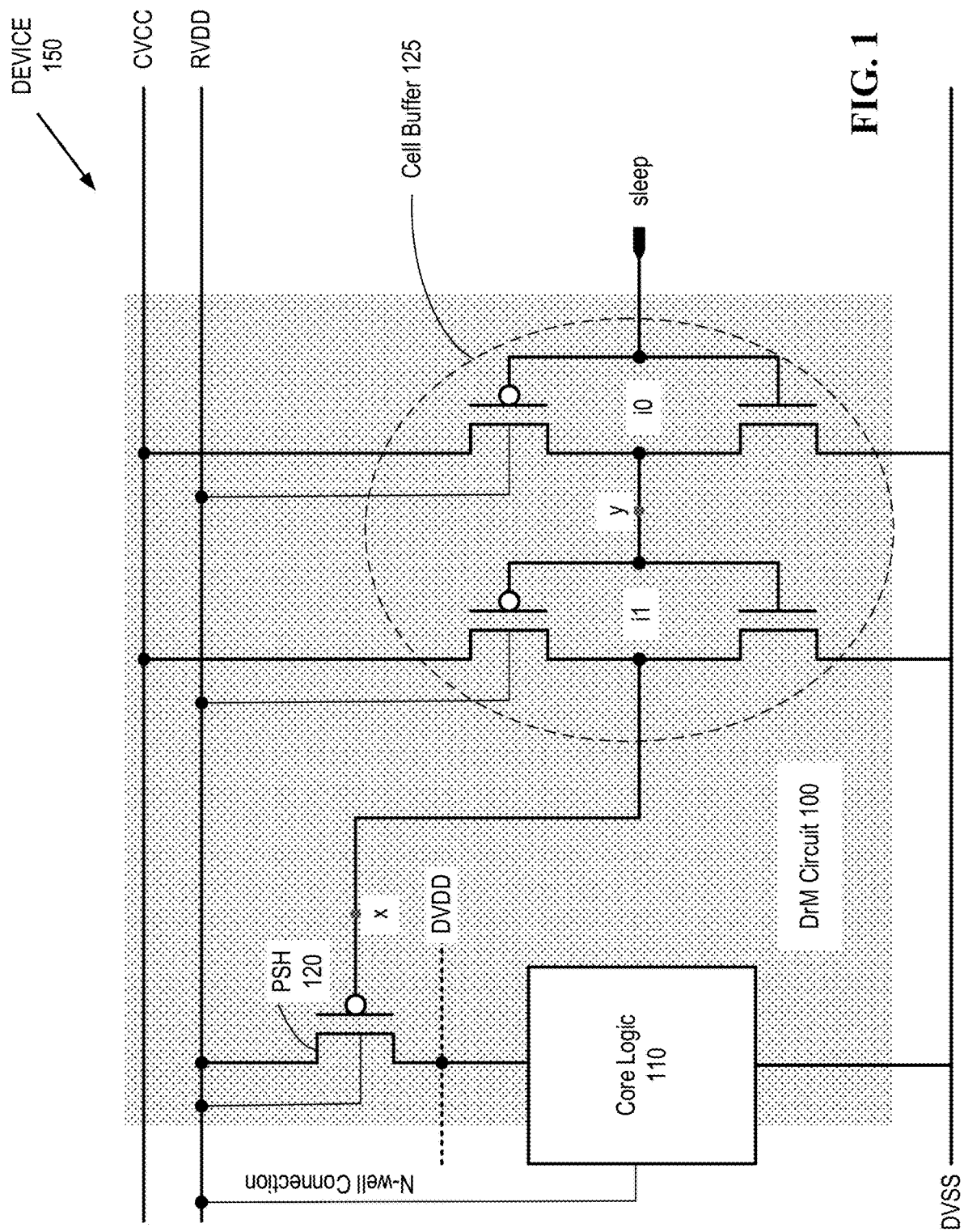
FIG. 1 is a schematic diagram of a circuit for leakage current reduction according to one embodiment.

In the following description, numerous specific details are set forth. However, it is understood that embodiments of the invention may be practiced without these specific details. In other instances, well-known circuits, structures and techniques have not been shown in detail in order not to obscure the understanding of this description. It will be appreciated, however, by one skilled in the art, that the invention may be practiced without such specific details. Those of ordinary skill in the art, with the included descriptions, will be able to implement appropriate functionality without undue experimentation.

Embodiments of the invention reduce the leakage current of a dual rail device. The device may be a system-on-a-chip (SOC) device which further includes a memory cell array, peripheral logic and core logic. The device may be a processing device with embedded memory. The device may be a mobile device, an IoT device or another low-power device which may operate on battery power. The core logic may be a processing core in a processor such as a central processing unit (CPU), a graphic processing unit (GPU), a digital signal processor (DSP), a media processor, an image processor, an arithmetic logic unit (ALU), or other general-purpose or special-purpose processing circuitry. The peripheral logic may include circuit that controls memory access and timing. An example of the memory cell array is a cache memory, such as a static RAM (SRAM), or other volatile or non-volatile on-processor memory.

In the following description, the terms "connect," "connected" and their derivatives, are used to indicate that two or more elements, which may or may not be in direct physical contact, have an electrical connection between or among them. Thus, the terms "connect" and "connected" hereinafter are used equivalently to "electrically connect" and "electrically connected," respectively. The terms "disconnect," "disconnected" and their derivatives, are used to indicate that two or more elements, which may or may not be in direct physical contact, do not have an electrical connection between or among them. Thus, the terms "disconnect" and "disconnected" hereinafter are used equivalently to "electrically disconnect" and "electrically disconnected," respectively.

In one embodiment, the memory cell array is powered by a first power rail supplying a first voltage level (CVCC), and the peripheral logic is powered by a second power rail supplying a second voltage level (RVDD), where RVDD is lower than CVCC. The core logic may be placed in a sleep state (also referred to as a standby state or a power down state) when not in use. To reduce leakage current in the sleep state, the device further includes a leakage reduction circuit, e.g., a DrM (Dual-Rail Multi-threshold Complementary Metal Oxide Semiconductor (MTCMOS)) circuit, to control the power supplied to the core logic. The DrM circuit includes, among other elements, power switches which connect the second power rail to the core logic to provide the operating voltage RVDD to the core logic. The power switch is turned on when the core logic is in an operating state to allow current to flow from the second power rail to the core logic, and turned off when the core logic is in the sleep state to cut off the current flow. In one embodiment, the power switch may be a semiconductor-based switch, e.g., a P-channel Metal Oxide Semiconductor Field Effect (P-MOSFET) transistor or a PMOS transistor.

According to embodiments of the invention, the power switch may receive the first voltage level (CVCC) at its gate terminal when the leakage reduction circuit receives a sleep signal for the core logic to enter the sleep state. Driving the gate terminal of the power switch with CVCC incurs less leakage current compared to having RVDD at the same gate terminal of the same power switch. That is, the leakage current can be reduced by raising the voltage level at the gate terminal of the power switch from RVDD to CVCC to turn off the power switch. Less leakage current at the power switch means less power wasted by the core logic when the core logic is in the sleep state. The leakage reduction circuit utilizes the first power rail, which supplies CVCC to the memory cell array, to drive the gate of the power switch. Thus, there is a minimal overhead in the amount of additional circuit required by the use of leakage reduction circuit.

Figure 3:
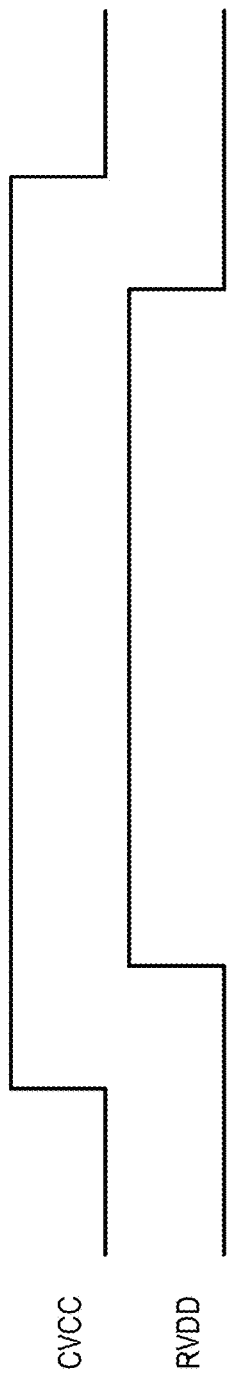
FIG. 3 is a timing diagram of a first power control sequence applied to the circuits of FIG. 1 and FIG. 2 according to one embodiment.
Figure 5:
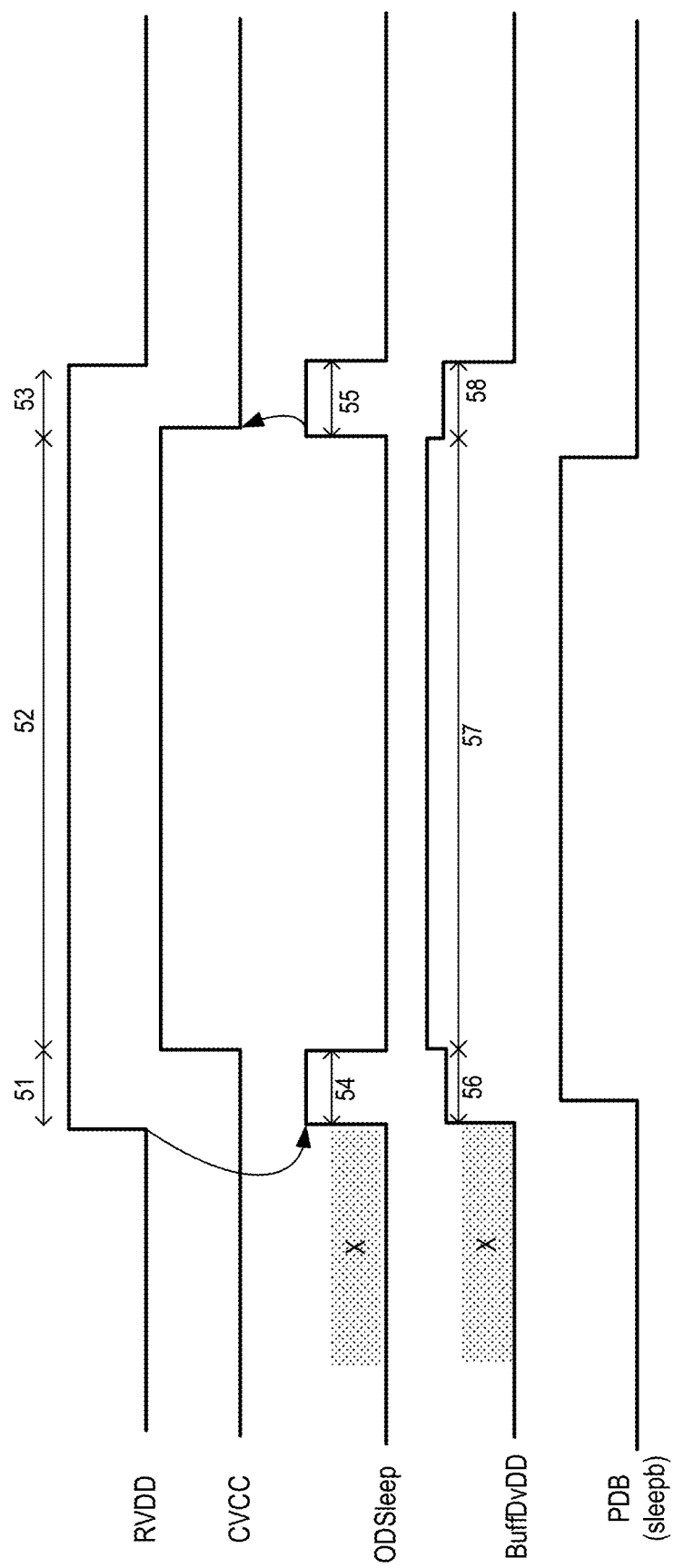
FIG. 5 is a timing diagram of a second power control sequence and control signals applied to the circuit of FIG. 4 according to one embodiment.

The dual power rails may provide CVCC and RVDD according to a power control sequence specified for a device. Depending on the timing of CVCC and RVDD, different leakage reduction circuits may be provided for the device. A first power control sequence (as shown in FIG. 3) specifies that the first power rail be turned on before the second power rail is turned on, and that the first power rail be turned off after the second power rail is turned off. That is, the first voltage level (CVCC) is available on the first power rail before the second voltage level (RVDD) is available on the second power rail, and the first voltage level (CVCC) becomes unavailable on the first power rail after the second voltage level (RVDD) becomes unavailable on the second power rail. A second power control sequence (as shown in FIG. 5) specifies that the second power rail be turned on before the first power rail is turned on, and that second power rail be turned off after the first power rail is turned off. That is, the second voltage level (RVDD) is available on the second power rail before the first voltage level (CVCC) is available on the first power rail, and the second voltage level (RVDD) becomes unavailable on the second power rail after the first voltage level (CVCC) becomes unavailable on the first power rail. In the description herein, the terms "available" and "enabled" are used interchangeably, and the terms "unavailable" and "disabled" are also used interchangeably.

FIG. 1 is a schematic circuit diagram of a device 150 including a DrM circuit 100 according to one embodiment. The device 150 operates according to the first power control sequence in FIG. 3. The device 150 includes additional circuit elements not shown in FIG. 1, such as a memory cell array coupled to a first power rail to receive CVCC, and a peripheral circuit coupled to a second power rail to receive RVDD.

The DrM circuit 100, as shown in the dotted area of FIG. 1, is coupled to a core logic 110 and includes a power switch (PSH) 120 receiving a voltage at its gate terminal from a cell buffer 125. The cell buffer 125 includes a first inverter (i0) coupled to a second inverter (i1). Each of the inverters includes a CMOS circuit that further includes a PMOS transistor coupled to an NMOS transistor. Both inverters (i0 and i1) receive a pull-up voltage CVCC (provided by the first power rail) on one end, and a pull-down voltage DVSS on the other end. The second voltage level RVDD is provided to the N-well of the CMOS circuits in the cell buffer 125, the PSH 120 and the core logic 110. In one embodiment, the N-well of the cell buffer 125, the PSH 120 and the core logic 110 are non-isolated; i.e., they are located in the same N-well. When inverter i0 receives a sleep signal (asserted on high), the input to inverter i1 (at node y) is low, pulling up the output of inverter i1 (at node x) to CVCC. Thus, the PSH 120 is turned off, cutting off the current to the core logic 110. Turning off the PSH 120 with CVCC, instead of RVDD, significantly reduces the sub-threshold leakage current that flows from RVDD through the PSH 120 to the core logic 110 during the sleep state.

Figure 2:
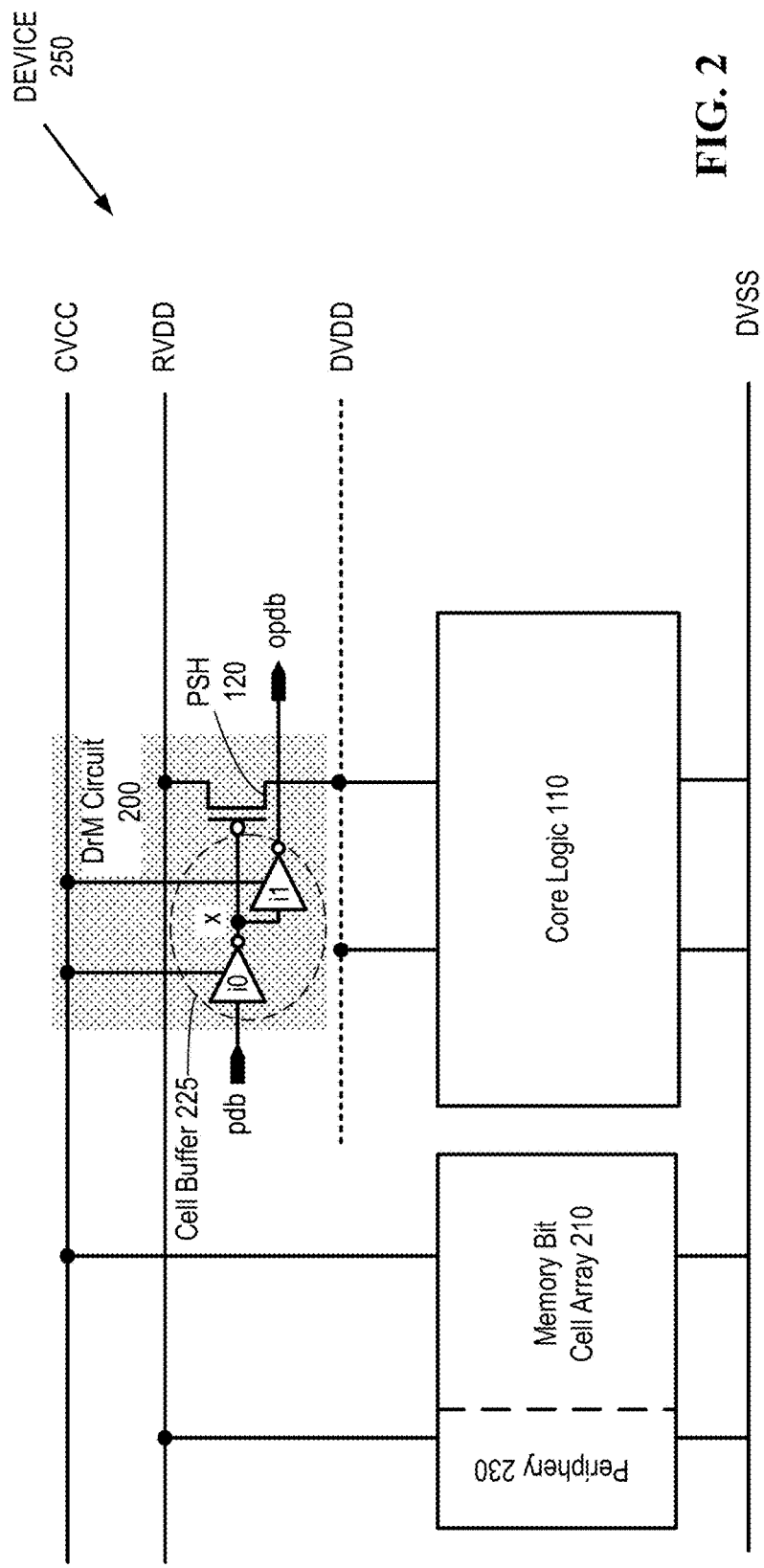
FIG. 2 is a schematic diagram of a circuit for leakage current reduction according to another embodiment.

FIG. 2 is a schematic circuit diagram of a device 250 including a DrM circuit 200 according to another embodiment. The device 250 operates according to the first power control sequence of FIG. 3. The DrM circuit 200, as shown in the dotted area of FIG. 2, is coupled to the core logic 110 and includes the PSH 120 receiving a voltage at its gate terminal from the output of the first inverter (i0). In this embodiment, the input to inverter i0 is a sleep signal (an inverted power down signal pdb), which is asserted on low; that is, the core logic 110 enters the sleep state when pdb is low. The DrM circuit 200 includes a cell buffer 225 which further includes inverters i0 and i1, which may be the same CMOS inverters i0 and i1 as in the DrM circuit 100 of FIG. 1. Both inverters (i0 and i1) in the DrM circuit 200 receive a pull-up voltage CVCC (provided by the first power rail) on one end, and a pull-down voltage DVSS on the other end. The second voltage level RVDD is provided to a peripheral logic 230, as well as the N-well of the CMOS circuits in the cell buffer 225 and the core logic 110. For simplicity of the illustration, the N-well connections are not shown in FIG. 2. The first voltage level CVCC is provided to a memory bit cell array 210 in the device 250.

When inverter i0 receives a low pdb signal, the output of inverter i0 (at node x) is pulled up to CVCC. Thus, the PSH 120 is turned off, cutting off the current to the core logic 110. Turning off the PSH 120 with CVCC, instead of RVDD, significantly reduces the sub-threshold leakage current that flows from RVDD through the PSH 120 to the core logic 110 during the sleep state.

In the DrM circuit 200, the output of inverter i0 is coupled to the second inverter (i1), which outputs an output version of pdb, referred to as opdb. The signals opdb and pdb have the same waveform and the same magnitude.

The DrM circuit 200 in FIG. 2 only shows one of the multiple stages in a delay chain that drives current into the core logic 110. The number of stages may depend on the size and required current of the core logic 110. In some embodiments, a device may include hundreds or thousands of such stages in a delay chain. Each stage includes a corresponding power switch (e.g., the PSH 120) to connect a corresponding portion of the core logic 110 to the second power rail (RVDD). Each stage also includes a corresponding cell buffer (e.g., the cell buffer 225) to control the on and off of the PSH 120 in the same stage, and to overdrive the gate terminal of the PSH 120 in the same stage with CVCC to turn off the PSH 120. The opdb signal of one stage is fed into a next stage as an input pdb signal to the next stage. That is, a sleep signal (in this case, the pdb signal) propagates from one stage to a next stage in the delay chain to cause the core logic 110 to enter the sleep state.

FIG. 3 illustrates the first power control sequence for CVCC (supplied by the first power rail) and RVDD (supplied by the second power rail). According to the first power control sequence, CVCC is available before RVDD is available, and remains available for a time period after RVDD becomes unavailable.

Figure 4:
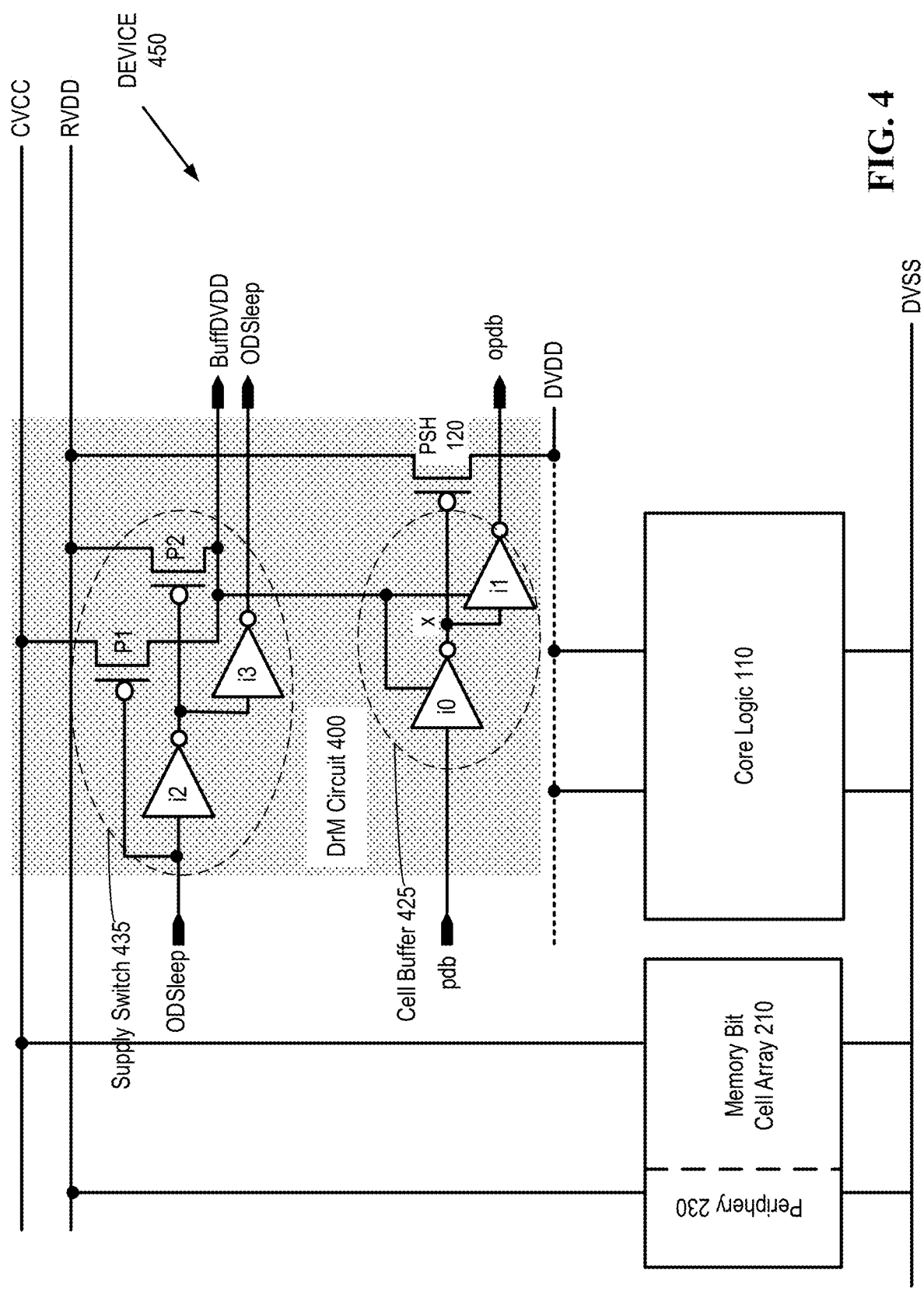
FIG. 4 is a schematic diagram of a circuit for leakage current reduction according to yet another embodiment.

FIG. 4 is a schematic circuit diagram of a device 450 including a DrM circuit 400 according to yet another embodiment. The device 450 operates according to the second power control sequence of FIG. 5. The device 450 may include multiple stages, with each stage including the PSH 120, a cell buffer 425 and a supply switch 435. For simplicity of the illustration, the N-well connections are not shown in FIG. 4.

The cell buffer 425 is coupled to the core logic 110 and includes the same inverters i0 and i1 as in the cell buffer 225 of FIG. 2. Each stage of the cell buffer 425 drives the gate terminal of a corresponding PSH 120 in the same stage. Unlike in FIG. 2 where the inverters i0 and i1 are pulled up to CVCC, the inverters i0 and i1 in FIG. 5 are pulled up to BuffDVDD. The BuffDVDD signal is the output of the supply switch 435.

The supply switch 435 is connected between the cell buffer 425 and the first and second power rails. The supply switch 435 outputs BuffDVDD, which is equal to CVCC in a first time period, and is equal to RVDD in a second time period. The first time period include a time duration when CVCC is available. The second time period includes a time duration when the CVCC is unavailable and RVDD is available. The supply switch 435 is used in a device operating according to the second power control sequence to avoid unknown or race conditions when CVCC is unavailable to overdrive the gate terminal of the PSH 120.

The supply switch 425 includes two inverters i2 and i3 connected to a first transistor switch p1 and a second transistor switch p2. In this embodiment, both p1 and p2 are PMOS transistors. The first transistor switch p1 connects the first power rail (CVCC) to the cell buffer 425. The pull-up end of p1 is pulled up to CVCC and its gate terminal is driven by a control signal ODSleep. The second transistor switch p2 connects the second power rail (RVDD) to the cell buffer 425. The pull-up end of p2 is pulled up to RVDD and its gate terminal is driven by the output of inverter i2 (which is the inverted ODSleep). The switches p1 and p2 are turned on and turned off according to the control signal ODSleep. Inverter i3 inverts the output of inverter i2 to generate ODSleep for the next stage.

Thus, when the pdb signal is low at the input of inverter i0 (sleep state enabled) and CVCC is available, the cell buffer 425 is operative to overdrive the gate terminal of the PSH 120 with CVCC. Thus, the PSH 120 is turned off to cut off the current supplied to the core logic 110. When pdb is low and CVCC is unavailable and RVDD is available, the cell buffer 425 drives the gate terminal of the PSH 120 with RVDD to turn off the PSH 120 and to thereby cut off the current supplied to the core logic 110. The leakage current when PSH 120 is turned off is significantly less when the gate terminal of the PSH 120 is driven by CVCC than by RVDD.

FIG. 5 is a timing diagram illustrating a number of signals that control the DrM circuit 400 (FIG. 4) according to one embodiment. The top two rows show the power control sequence of RVDD and CVCC, in which CVCC comes up after RVDD is up, and goes down before RVDD is down. Time period 51 marks the "power up" time, time period 52 marks the "software ready" time, and time period 53 marks the "power down" time. Time periods 54 and 55, which indicate when RVDD is available but CVCC is unavailable, are captured by the ODSleep signal. The first rising edge of ODSleep (of time period 54) is triggered by the rising edge of RVDD, and the second rising edge of ODSleep (of time period 55) triggers the falling edge of CVCC. The timing diagram of FIG. 5 shows that ODSleep signal is high when RVDD is available and CVCC is unavailable, such that the aforementioned unknown or race conditions when CVCC is unavailable can be avoided.

As shown in the circuit schematics of FIG. 4, the ODSleep signal causes the supply switch 425 to select between RVDD and CVCC, and outputs BuffDVDD. Three time periods are marked in the signal BuffDVDD; in time periods 56 and 58 (when ODSleep is high), BuffDVDD is equal to RVDD, and in time period 57 (when ODSleep is low), BuffDVDD is equal to CVCC. The pdb signal (i.e., the sleep signal sleepb asserted on low) may go high anytime during time periods 56, 57 and 58, to enable the operating state (i.e., disable the sleep state) of the core logic 110 by turning on the PSH 120 and supplying power to the core logic 110.

FIG. 6 is a table illustrating the corresponding states of a number of control signals and switches in the DrM circuit 400 (FIG. 4) according to one embodiment. The top portion of the table indicating "non-overdrive mode" corresponds to time periods 56 and 58 in FIG. 5. The bottom portion of the table indicating "overdrive mode" corresponds to time period 57 in FIG. 5. Referring back to FIG. 4, the non-overdrive mode is when the ODSleep signal is "1" such that BuffDVDD output from the supply switch 435 is RVDD. Thus, the PSH 120 is turned off by RVDD at the gate terminal when the core logic 110 enters the sleep state (i.e., when pdb is "0"). The overdrive mode is when the ODSleep signal is "0" such that BuffDVDD output from the supply switch 435 is CVCC. Thus, the PSH 120 is turned off by CVCC at the gate terminal when the core logic 110 enters the sleep state (i.e., when pdb is "0"). It is understood that the logic levels "0" and "1" described herein are illustrative; in alternative embodiments, the logic levels and the corresponding signal levels may be inverted from what is shown and described herein. A leakage reduction circuit in these alternative embodiments may include additional inverters to work with the inverted signals.

Figure 7:
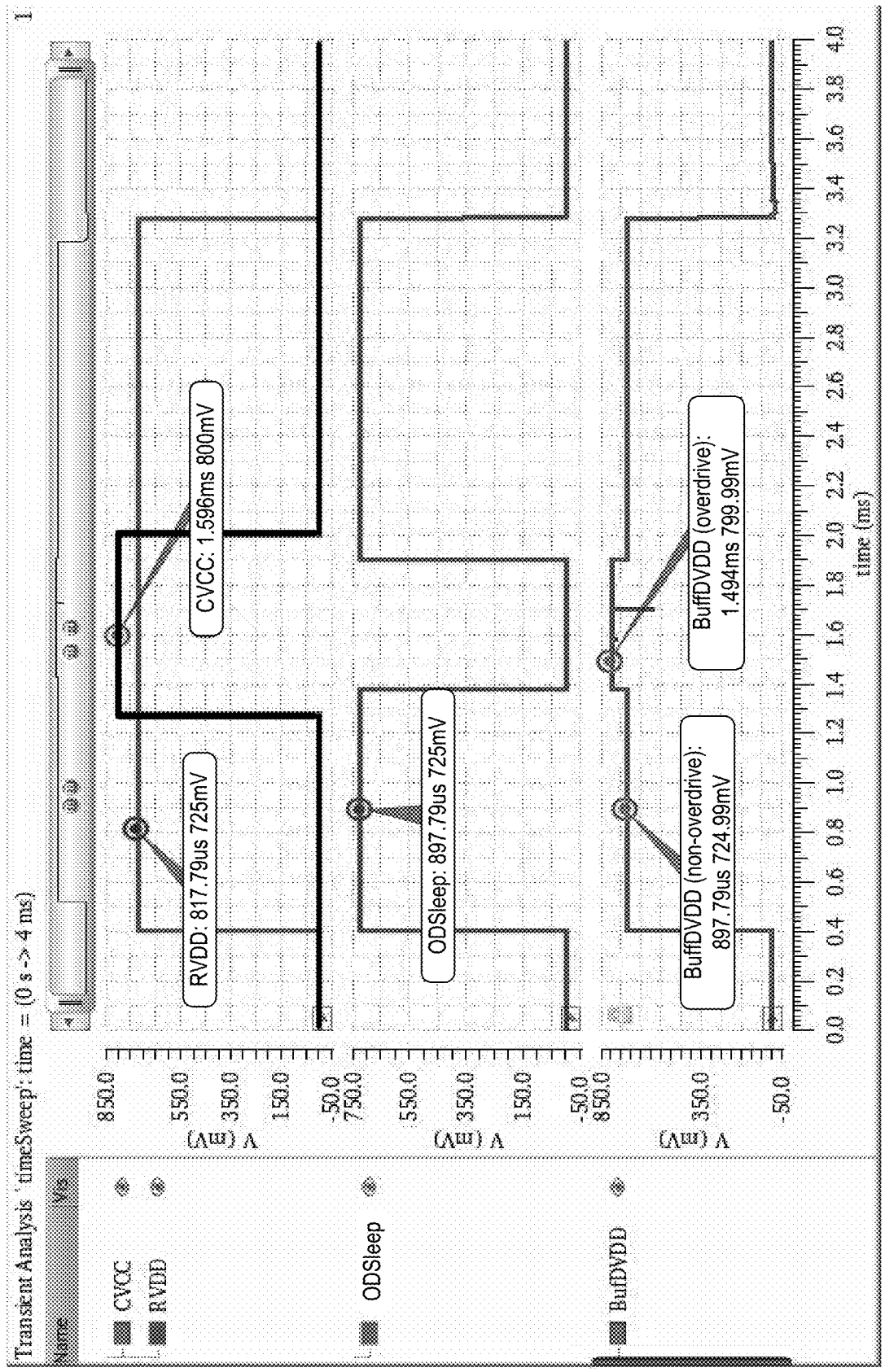
FIG. 7 is a timing diagram of signals in the circuit of FIG. 4 according to one embodiment.
Figure 8:
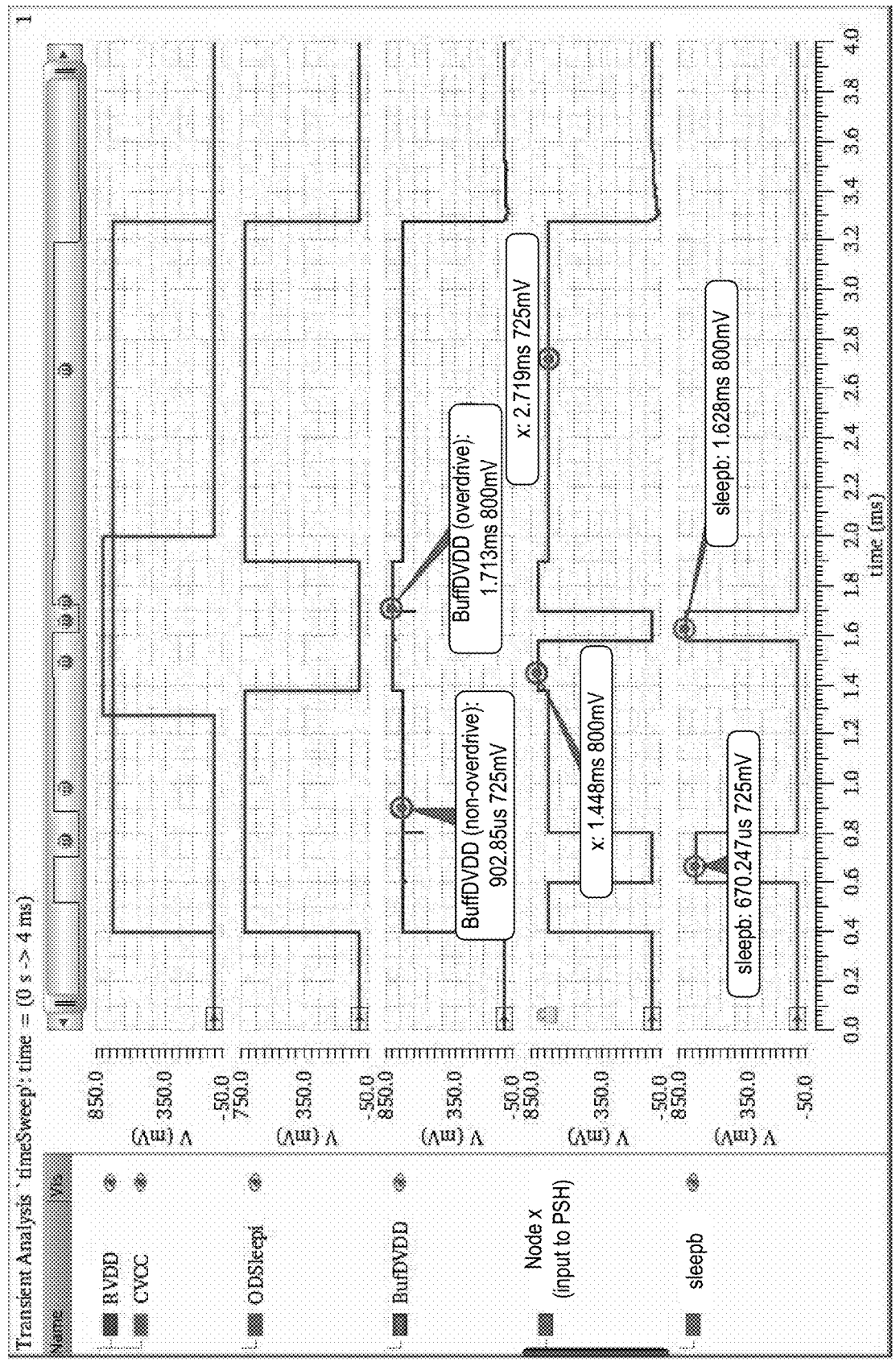
FIG. 8 is a timing diagram of additional signals in the circuit of FIG. 4 according to one embodiment.

FIG. 7 are FIG. 8 are timing diagrams illustrating a number of signals that control the DrM circuit 400 (FIG. 4) according to another embodiment. FIG. 7 illustrates the relationship among CVCC, RVDD, ODSleep and BuffDVDD. FIG. 8 further illustrates the input signal to the PSH 120 (at node x in FIG. 4) and the sleepb (i.e., pdb) signal. FIGS. 7 and 8 show that ODSleep is high when RVDD is available and CVCC is unavailable, and may remain high for a short time period after CVCC becomes available. The time duration when ODSleep signal is low is also when both CVCC and RVDD are available.

Figure 9:
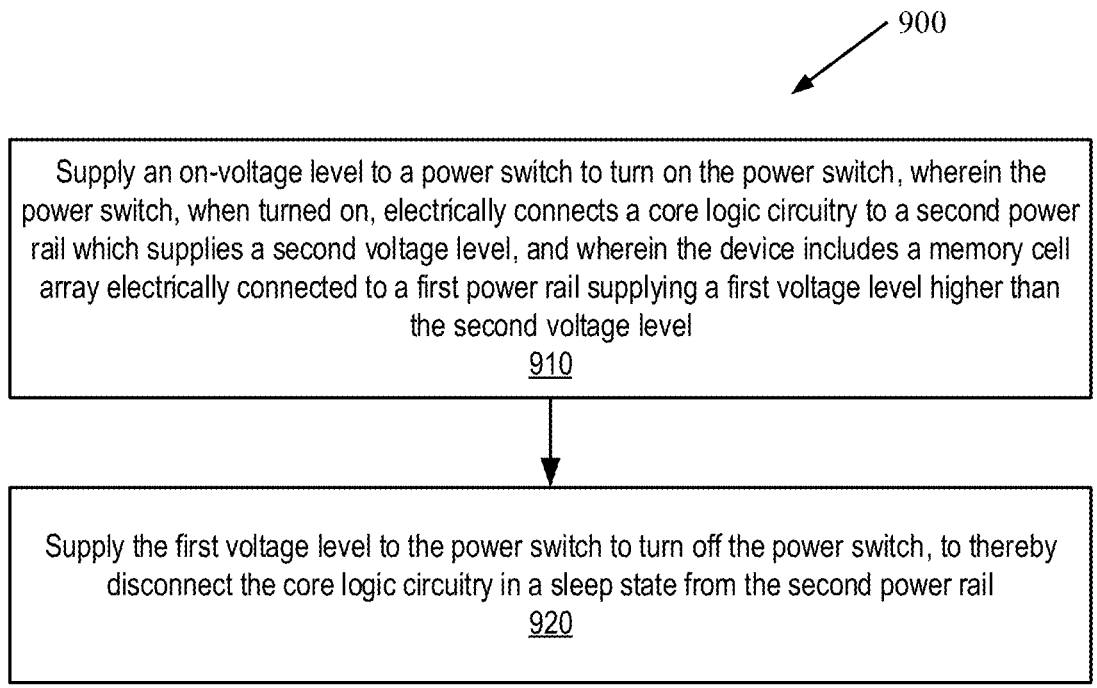
FIG. 9 is a flow diagram illustrating a method performed by a device for reducing leakage current according to one embodiment.

FIG. 9 is a flow diagram illustrating a method 900 performed by a device for leakage power reduction according to one embodiment. The method 900 begins at step 910 with the device supplying an on-voltage level to a power switch to turn on the power switch. The power switch, when turned on, electrically connects a core logic circuitry to a second power rail which supplies a second voltage level, and the device includes a memory cell array electrically connected to a first power rail supplying a first voltage level higher than the second voltage level. At step 920, the device further supplies the first voltage level to the power switch to turn off the power switch, to thereby disconnect the core logic circuitry in a sleep state from the second power rail.

In an embodiment where the power switch is a PMOS transistor, the on-voltage may be the ground voltage or another voltage representing the logic zero. The first voltage level may be the CVCC and the second voltage level may be the RVDD described above.

Figure 10:
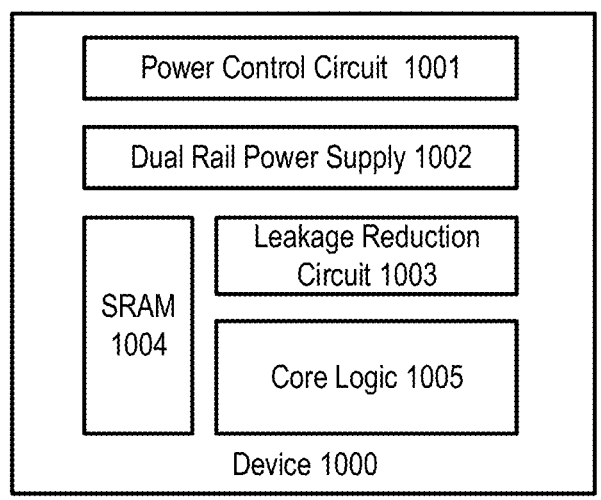
FIG. 10 is a diagram illustrating a device comprising a leakage reduction circuit according to one embodiment.

FIG. 10 is a device 1000 operative to perform the method 900 according to one embodiment. The device 1000 includes a power control circuit 1001, which generates the sleep signal in FIG. 1, the pdb signal in FIGS. 2 and 4, and the ODSleep signal in FIG. 4. The device 1000 also includes a dual rail power supply 1002, which further includes a first power rail supplying CVCC and a second power rail supplying RVDD. The device 1000 also includes a memory cell array, such as an SRAM array 1004, and a core logic circuitry 1005, which is an example of the core logic 110 shown in FIGS. 1, 2 and 4. The device 1000 also includes a leakage reduction circuit 1003, which, for example, includes the PSH 120 in FIG. 1, 2 or 4, and the cell buffer (125 in FIG. 1, 225 in FIG. 2 or 425 in FIG. 4). The leakage reduction circuit 1003 may further includes the supply switch 435 in FIG. 4 in some embodiments. Examples of the device 1000 include, but are not limited to, a mobile computing and/or communication device (e.g., a smartphone, a tablet, a laptop, an IoT device, etc.). The device 1000 may be an example of the device 150 in FIG. 1, the device 250 in FIG. 2 or the device 450 in FIG. 4.

The operations of the flow diagram of FIG. 9 have been described with reference to the exemplary embodiments of FIGS. 1, 2, 4, 5 and 10. However, it should be understood that the operations of the flow diagram of FIG. 9 can be performed by embodiments of the invention other than those discussed with reference to FIGS. 1, 2, 4, 5 and 10, and the embodiments discussed with reference to FIGS. 1, 2, 4, 5 and 10 can perform operations different than those discussed with reference to the flow diagram. While the flow diagram of FIG. 9 shows a particular order of operations performed by certain embodiments of the invention, it should be understood that such order is exemplary (e.g., alternative embodiments may perform the operations in a different order, combine certain operations, overlap certain operations, etc.).

While the invention has been described in terms of several embodiments, those skilled in the art will recognize that the invention is not limited to the embodiments described, and can be practiced with modification and alteration within the spirit and scope of the appended claims. The description is thus to be regarded as illustrative instead of limiting.

What is claimed is:

1. A device operative to reduce leakage current, comprising:
   a memory cell array electrically connected to a first power rail which supplies a first voltage level;
   a power switch; and
   a core logic circuitry electrically connected to a second power rail via the power switch when the power switch is turned on, wherein the second power rail supplies a second voltage level which is lower than the first voltage level,
   wherein the power switch is to be turned off when a gate terminal of the power switch receives a voltage level that is higher than the second voltage level and is supplied by the first power rail, to thereby disconnect the core logic circuitry in a sleep state from the second power rail.

2. The device of claim 1, further comprising:
   a delay chain formed by a plurality of stages to propagate a sleep signal from one stage to a next stage to thereby cause the core logic circuitry to enter the sleep state, each stage including a corresponding power switch to connect a corresponding portion of the core logic circuitry to the second power rail.

3. The device of claim 1, further comprising:
   a cell buffer operative to turn on and off of the power switch, wherein the cell buffer includes at least one inverter having a pull-up end connected to the first power rail.

4. The device of claim 3, wherein the device operates according to a first power control sequence, in which the first voltage level is available on the first power rail before the second voltage level is available on the second power rail, and the first voltage level becomes unavailable on the first power rail after the second voltage level becomes unavailable on the second power rail.

5. The device of claim 1, further comprising:
   a supply switch which outputs the first voltage level to a cell buffer in a first time period, and outputs the second voltage level to the cell buffer in a second time period; and
   the cell buffer operative to turn on and off of the power switch and to supply output of the supply switch to the gate terminal of the power switch.

6. The device of claim 5, wherein the supply switch further includes a first transistor switch connecting the first power rail to the cell buffer, and a second transistor switch connecting the second power rail to the cell buffer, and wherein the first transistor switch and the second transistor switch are turned on and turned off according to a control signal.

7. The device of claim 5, wherein the second time period includes a time duration when the first voltage level is unavailable and the second voltage level is available.

8. The device of claim 5, wherein the device operates according to a second power control sequence, in which the second voltage level is available on the second power rail before the first voltage level is available on the first power rail, and the second voltage level becomes unavailable on the second power rail after the first voltage level becomes unavailable on the first power rail.

9. The device of claim 1, further comprising:
   Multi-threshold Complementary Metal Oxide Semiconductor (MTCMOS) transistors operative to turn on and off of the power switch.

10. The device of claim 1, wherein the power switch is a P-channel Metal Oxide Semiconductor (PMOS) transistor.

11. A method performed by a device for leakage current reduction, comprising:
- receiving, by a gate terminal of a power switch, an on-voltage level to turn on the power switch, wherein the power switch, when turned on, electrically connects a core logic circuitry to a second power rail which supplies a second voltage level, and wherein the device includes a memory cell array electrically connected to a first power rail supplying a first voltage level higher than the second voltage level; and
- receiving, by the gate terminal of the power switch, a voltage level that is higher than the second voltage level and is supplied by the first power rail to thereby turn off the power switch and disconnect the core logic circuitry in a sleep state from the second power rail.

12. The method of claim 11, further comprising:
propagating a sleep signal from one stage to a next stage in a delay chain that includes a plurality of stages to cause the core logic circuitry to enter the sleep state, each stage includes a corresponding power switch to connect a corresponding portion of the core logic circuitry to the second power rail.

13. The method of claim 11, wherein the first voltage level is supplied to a gate terminal of the power switch by an inverter having a pull-up end connected to the first power rail.

14. The method of claim 13, wherein the device operates according to a first power control sequence, in which the first voltage level is available on the first power rail before the second voltage level is available on the second power rail, and the first voltage level becomes unavailable on the first power rail after the second voltage level becomes unavailable on the second power rail.

15. The method of claim 1, further comprising:
- outputting, by a supply switch, the first voltage level to a cell buffer in a first time period; and
- outputting, by the supply switch, the second voltage level to the cell buffer in a second time period, wherein the cell buffer is operative to control on and off of the power switch and to supply output of the supply switch to a gate terminal of the power switch.

16. The method of claim 15, further comprising:
receiving, by the supply switch, a control signal which turns on a first transistor switch to output the first voltage level to the cell buffer in the first time period, and turns on a second transistor switch to output the second voltage level to the cell buffer in the second time period.

17. The method of claim 15, wherein the second time period includes a time duration when the first voltage level is unavailable and the second voltage level is available.

18. The method of claim 15, wherein the device operates according to a second power control sequence, in which the second voltage level is available on the second power rail before the first voltage level is available on the first power rail, and the second voltage level becomes unavailable on the second power rail after the first voltage level becomes unavailable on the first power rail.

19. The method of claim 11, further comprising:
turning on and off of the power switch with Multi-threshold Complementary Metal Oxide Semiconductor (MTCMOS) transistors.

20. The method of claim 11, wherein the power switch is a P-channel Metal Oxide Semiconductor (PMOS) transistor.

* * * * *

UNITED STATES PATENT AND TRADEMARK OFFICE
CERTIFICATE OF CORRECTION

PATENT NO. : 11,004,480 B2
APPLICATION NO. : 16/253210
DATED : May 11, 2021
INVENTOR(S) : Jayapal et al.

Page 1 of 1

It is certified that error appears in the above-identified patent and that said Letters Patent is hereby corrected as shown below:

On the Title Page

Item (73), correct the name of the assignee by replacing:
[[(73) Assignee: MediaTek Inc., Hsinchu (TW)]]
With the following:
(73) Assignee: MediaTek Singapore Pte. Ltd., Singapore (SG)

Signed and Sealed this
Thirty-first Day of August, 2021

Drew Hirshfeld
*Performing the Functions and Duties of the*
*Under Secretary of Commerce for Intellectual Property and*
*Director of the United States Patent and Trademark Office*